United States Patent [19]

Harada

[11] Patent Number: 5,053,645

[45] Date of Patent: Oct. 1, 1991

[54] THRESHOLD LOGIC CIRCUIT

[75] Inventor: Yutaka Harada, Tokyo, Japan

[73] Assignee: Research Development Corporation, Tokyo, Japan

[21] Appl. No.: 510,183

[22] Filed: Apr. 17, 1990

[30] Foreign Application Priority Data

Apr. 18, 1989 [JP] Japan .................................. 1-97763

[51] Int. Cl.$^5$ ................... H03K 19/023; H03K 19/086
[52] U.S. Cl. .................................... 307/464; 307/201; 307/455
[58] Field of Search ........................ 307/201, 455, 464

[56] References Cited

U.S. PATENT DOCUMENTS

| 3,378,695 | 4/1968 | Marette | 307/464 |
| 3,916,215 | 10/1975 | Gaskill, Jr. et al. | 307/464 X |
| 4,593,249 | 6/1986 | Arita et al. | 307/464 X |
| 4,617,475 | 10/1986 | Reinschmidt | 307/464 X |

OTHER PUBLICATIONS

"Artificial Neural Networks for Computing", by Jackel et al., Jrnl. of Vacuum Society Tech., B4(1), Jan. Feb. 1986, pp. 61-63.

Primary Examiner—Stanley D. Miller
Assistant Examiner—David R. Bertelson
Attorney, Agent, or Firm—Fleit, Jacobson, Cohn, Price, Holman & Stern

[57] ABSTRACT

In a threshold logic circuit, digital input signals are weighted and summed up and then the sum of weighted digital signals is compared with a threshold value. The threshold logic circuit comprises a plurality of current switching circuits and means for summing up the output currents from the current switching circuit. The weights for the input signals are changed by controlling supply currents to the current switching circuits.

7 Claims, 4 Drawing Sheets

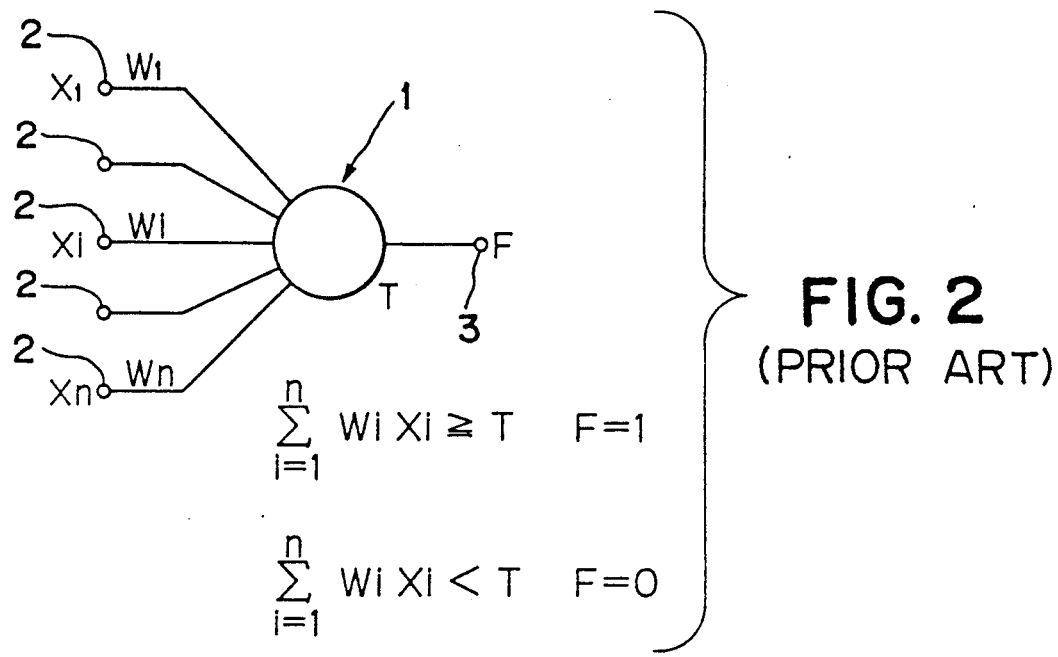
FIG. 2 (PRIOR ART)
FIG. 3
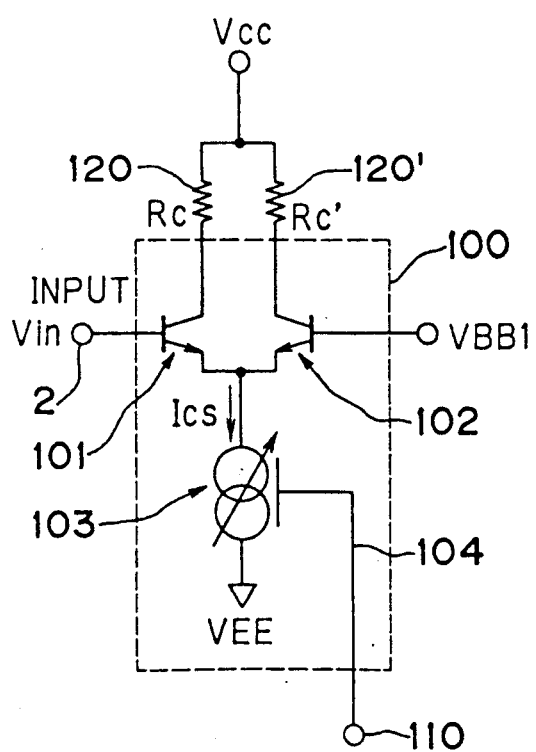

THRESHOLD LOGIC CIRCUIT

BACKGROUND OF THE INVENTION

This invention relates to threshold logic circuits, especially to majority logic circuits.

FIELD OF THE INVENTION

The conventional computers are built up with logic circuits comprising AND or OR circuits. These computers operate in an extreme high speed which highly exceeds the human ability and then contribute to the social prosperity. However, the conventional computers do not conform to the recognizing and the judging processes of human beings. In order to establish novel computers adequate for the recognizing and the judging processes, threshold logic circuits and new computer systems using these circuits have been provided, by taking the human brain cells(neuron) as a good model, in the treatries for instance by L. D. Jackel, R. E. Howard, H. P. Graf, B. Straughn, and J. D. Denker in "Artificial neural networks for computing" Journal of Vacuum Society Technology B4(1), Jan/Feb. 1986, pp. 61-63.

Hereinbelow, we will explain the threshold logic circuit for better understanding of this invention. FIG. 2 shows operation of the threshold circuit. The threshold logic circuit 1 has a plurality of input terminals 2, and at least one output terminal 3. In the threshold circuit 1, "0" or "1" digital signal Xi is applied to each input terminals 2. When a sum of weighted digital signals$\Sigma$ WiXi exeeds a threshold value, output is "1", otherwise "0" wherein Wi is a weight for a signal Xi. An important characteristic of the threshold logic circuits reside in the learning faculty. In other words, the weight Wi is changed by learning so as to sequentially establish a circuit adequate for a certain purpose. Therefore, it is required for the threshold logic circuits to have not only the faculty of swiching states of circuit elements by a sum of weighted input signals, but also the faculty of changing the weights Wi. In prior arts, to this end, a threshold circuit is simulated on a computer by using software. In more details, Multipling and summing operations to obtain a sum of weighted signals are carried out only by a software or by the help of complicated hardware circuit including a dedicated multiplier. The prior art threshold logic circuits have disadvantages. The processing speed by means of software is very slow, and the circuit utilising the multiplier has many circuit elements and then the system becomes bigger. As it will be clear from the brain cells, when the computer is built up by the threshold logic circuits, the more the number of circuit elements, the more the number of the faculties and the higher is the accuracy. Each circuit does not always need to have high accuracy. On the contrary, the threshold logic circuits must have a simple structure which make it possible to rise the scale of integration. In order to carry out the learning, the recognizing and the judging processes, the threshold logic circuits must be composed of high speed switching circuits.

SUMMARY OF THE INVENTION

An object of this invention is to provide threshold logic circuits which comprise high speed switching circuits and can arbitrarily change the weights and to provide computers which can attain good faculties for the recognizing and the judging processes utilizing a high speed learning mechanism.

According to this invention, a current switching circuit operaing in a high speed is utilized as the switching circuit and menas for changing supply current for the current switching circuit is used as the means for changing the weight.

BRIEF EXPLANATION OF THE DRAWINGS

FIG. 2 illustrates operation of a threshold logic circuit, FIG. 3 is a circuit diagram of a current switching circuit utilized in this invention.

DETAILED EXPLANATION OF SPECIFIC EMBODIMENTS

Figure 1:
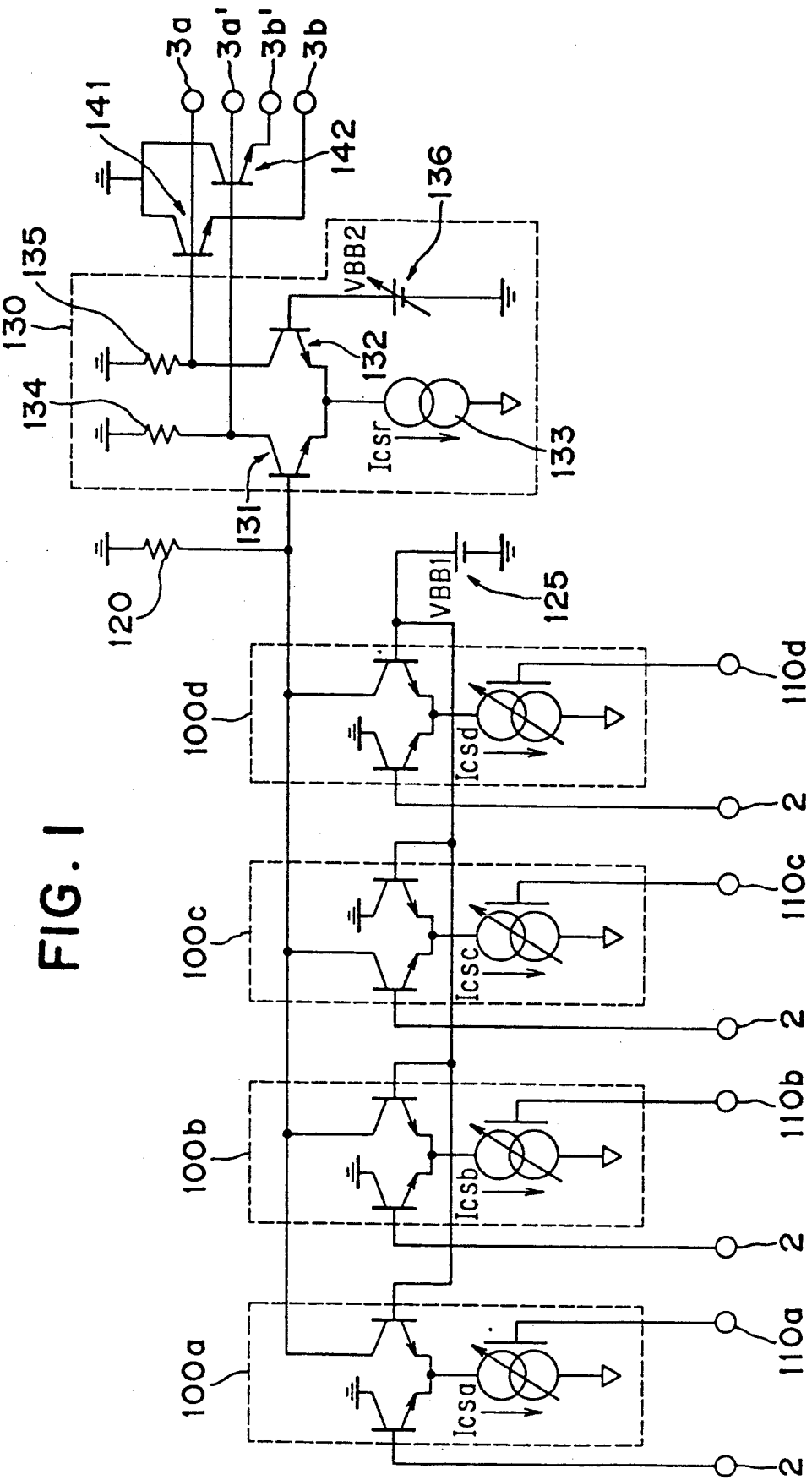
FIG. 1 is a circuit diagram showing a first example according to this invention.

Hereinbelow, we explain examples of this invention.

FIG. 3 shows a construction of a current switching circuit 100. In the current switching circuit 100, emitters of the first bipolar transistor 101 and the second bipolar transistor 102 are connected. To the connecting point, a variable current source 103 supplies supply current Ics. The variable current source 103 is controlled by a control line 104 to change the supply current Ics. Base of the first bipolar transistor 101 is supplied with input signal Vin through terminal 2. On the other hand, base of the second bipolar transistor 102 is supplied with a reference voltage vBB1. When the voltage Vin of the input signal of the current switching circuit 100 is higher than the first reference voltage, the first bipolar transistor 101 is in a active state and the second bipolar transistor 102 is in a cut-off state. Then, the supply current Ics of the variable current source 103 flows through the first bipolar transistor 101. Conversely, when the voltage Vin of the input signal of the current switching circuit 100 is lower than the reference voltage VBB1, the supply current Ics of the variable current source 103 flows through the second bipolar transistor 102. Collectors of the first and second bipolar transistors are connected to source Vcc through the collector registor 120, 120'. Thus, the current through the first or second bipolar transistors flows to the source Vcc. At this time, the voltage drop at the collector resistor is detected as an output signal. In this circuit construction, the signal of the collector resistor 120' has the same polarity as that of the input signal, output signal of the collector resistor 120 has an inverted signal to the input signal. The amplitude of the output signal is the product of the resistivity Rc or Rc' and the supply current Ics. Therefore, the output signal can be changed by varying the supply current Ics. By use of this circuit, the weights of the threshold logic circuit can be changed. Further, through the learning mechanism, the supply current of the current switching circuit can be changed so as to have an optimum weight.

FIG. 1 is a first example of a threshold logic circuit according to this invention. In this threshold logic circuit, a plurality of current switching circuits 100a, 100b, 100c and 100d shown in FIG. 2 are used. One of the collectors of the first and the second bipolar transistors 101, 102 of each current switching circuit is connected to the collector resistor 120. As explained with regard to FIG. 3, either one of the first and the second bipolar transistor 101 and 102 of the current switching circuit is selected depending on the polarity of the input signals to be weighted and summed. For instance, when positive signals are weighted and summed, the first bipolar transistors turn on. Conversely, when negative signals are weighted and summed, the second bipolar transistors 102 turn on. The base terminals of the second bipolar transistors 102 of the current switching circuits are connected to the reference voltage source 125 and supplied with a first reference voltage vBB1. In this circuit construction, according to the signals inputted to the input terminals 2, paths of the supply currents Icsa, Icsb, Icsc and Icsd representing respective weight signals are switched by the current switching circuits 100a, 100b, 100c and 100d so that the supply currents flow to the ground directly or through the collector resistor 120. The current flowing through the collector resistor 120 is a sum of the supply currents which are switched by the current switching circuits 100a, 100b, 100c and 100d. Therefore, the current flowing through the collector resistor 120 corresponds to a sum of weighted signals. This sum of the weighted signals are detected as a voltage drop across the collector resistor 120. This detected sum of the weighted signals is judged by a judging circuit 130, which comprises a current switching circuit wherein emitters of two bipolar transistors 131 and 132 are connected each other. This connection point is supplied with suppied current Icsr by the current source. Collectors of the bipolar transistors 131 and 132 are connected to the ground through the collector resistors 134 and 135. Base of the bipolar transistor 131 of the judging circuit 130 is connected to the collector resistor 120. The sum of the weighted signals is applied to the base of the bipolar transistor 131. The base of the bipolar transistor 132 of the judging circuit 130 is connected to a variable voltage source 136 and supplied with a second reference voltage VBB2. In this circuit construction, the sum of the weighted signals which is inputted to the base of the bipolar transistor 131 is compared with the reference voltage VBB2 and then the path of the supply current Icsr is switched by the current switching circuit. The switched supply current Icsr is detected by the collectors 134 and 135 and outputted directly from output terminals 3a and 3a' or from output terminals 3b and 3b' through an emitter follower made from bipolar transistor 141 and 142. In the first example, the second reference voltage VBB2 of the judging circuit 130 defines a threshold T of the logic circuit. As a result, by controlling the voltage source 136, the threshold T of the threshold circuit can be changed to form an optimum circuit construction.

Figure 4:
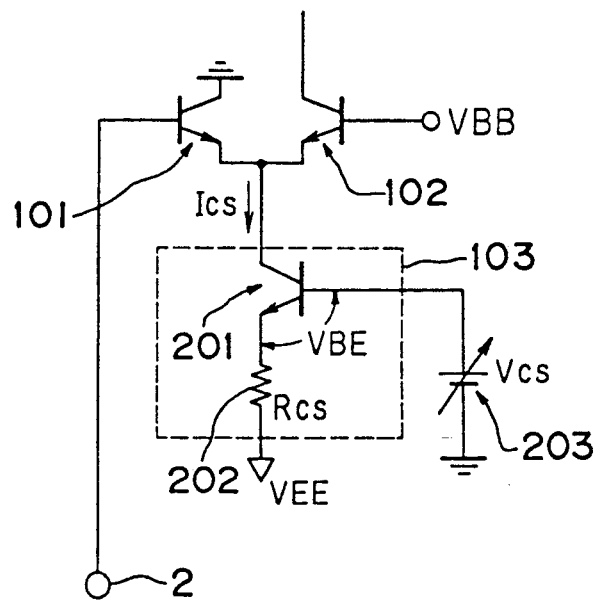
FIG. 4 shows a first means for controlling supply current for a current source.
Figure 5:
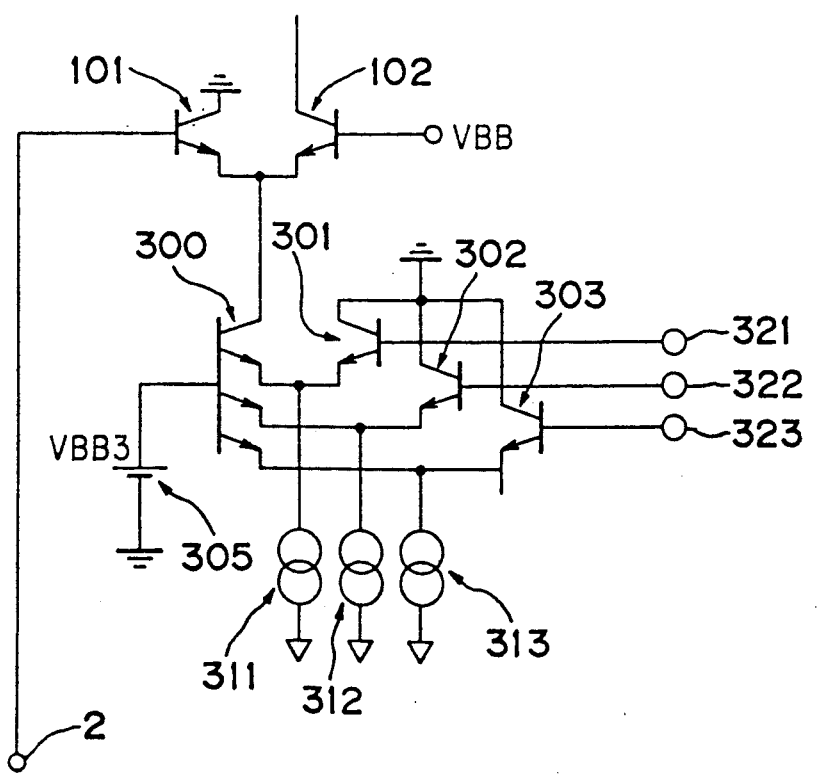
FIG. 5 shows a second means for controlling supply current for a current source.

FIG. 4 discloses means for changing the supply current Ics of the current switcing circuit. In this circuit, variable current circuit 103 comprises a serial connection of a bipolar transistor 201 and a resistor 202. The base voltage of the bipolar transistor 201 is controlled by a variable voltage source 203 which supplies voltage Vcs. In this circuit, the supply current Ics can be represented by the following equation.

$$Ics = (Vcs - VBE - VEE)/Rcs$$

where VEE is a voltage at an end of the resistor 202, VBE is a voltage between the base and the emitter of the bipolar transistor 201, Rcs is a resistivity of the resistor 202. The supply current Ics is contrrolled by the voltage Vcs of the variable voltage source 203. In FIG. 4, the variable voltage source 203 can be controlled in either an analog or a digital way. FIG. 5 shows another variable current source. This source is made up by combining a plurality of current swticing circuits. In this circuit, a plurality of current swticing circuits comprise a multi-emitter transistor 300, the base of which is supplied with a third reference voltage, transistors 301, 302 and 303 and constant current sources 311, 312 and 313. When supply currents of the current sources 311, 312 and 313 are set at distinct values, the supply current from the current switching circuit is controlled by changing the voltage patern applied to the terminals 321, 322 and 323. In the example shown in the FIG. 5, the circuit construction is simplied by use of the multi-emitter transistor. But, it is clear that the same faculty can be alternatively realized by connecting discrete current switching circuits.

Figure 6:
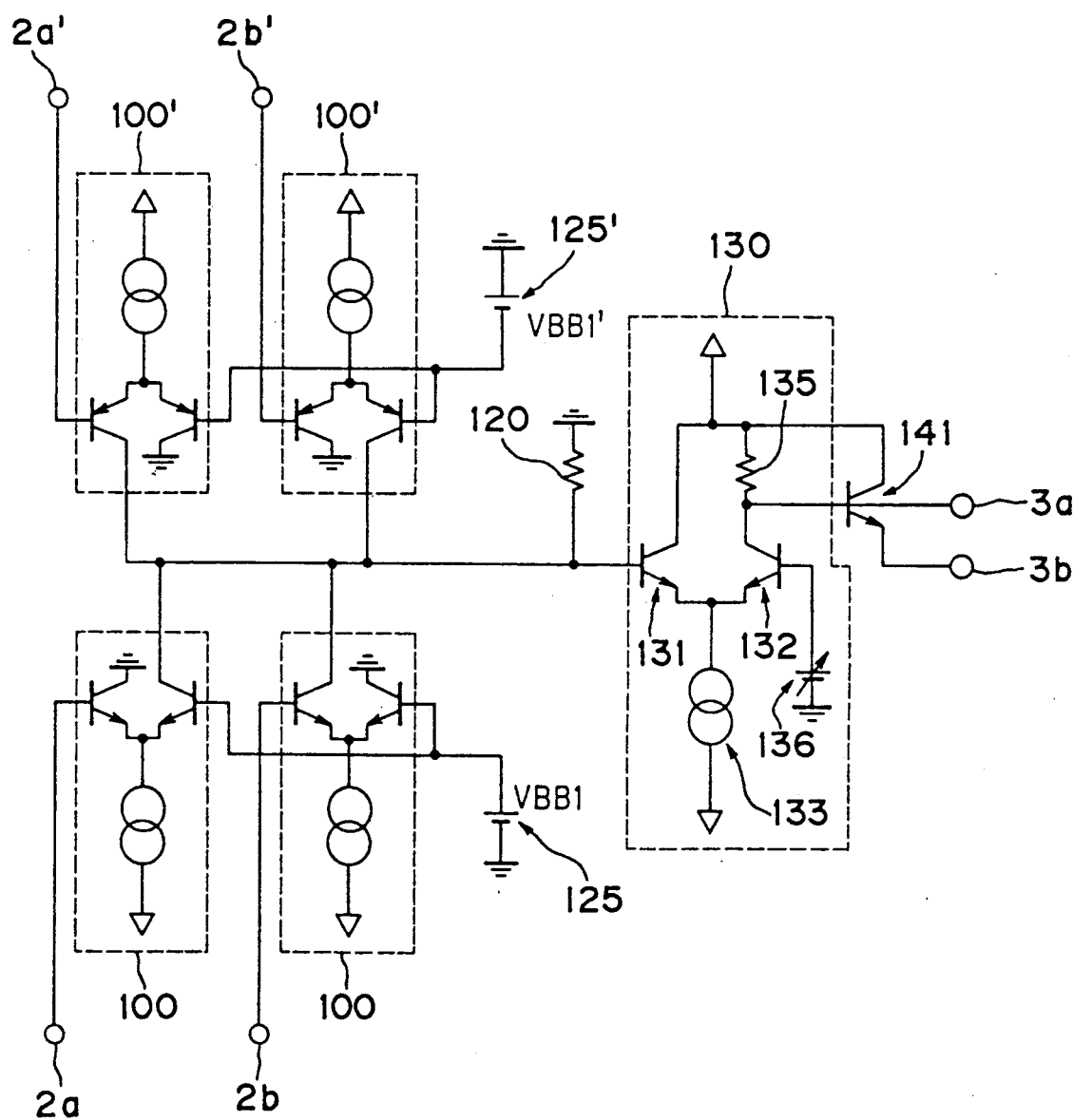
FIG. 6 is a circuit diagram showing a second example according to this invention.

FIG. 6 shows another example according to this invention. This invention is different from the first example shown in FIG. 1. a plurality of current switching circuits 100 using NPN transistors and a plurality of current switching circuits 100' using PNP transistors are connected through a collector resistor 120. Reference voltages of the current switching circuits are VBB1 and VBB1'. In this construction, an input signal of the current switching circuit 100 and an input signal of the current switching circuit 100' operate oppositly. Therefore, the circuit realizes two kind of operations, that is, excitement and sedation in the brain cells.

The above explanation has been made on the examples of current switching circuits using bipolar transistors. It is obvious that the same faculty as that of those examples can be alternatively realized by use of the field effective transistors(FETs) such as the galliumarsenic FET.

As described above, according to this inveniton, a threshold switching circuit having the learning faculty is constructed using a high speed switching circiut. Therefore, by using this threshold logic circuit, a high speed computer adequate for the recognizing and the judging processes is realized. This invention is absolutely necessary to established a high-speed computer to carry out a high-level recognizing and judging processes.

What is claimed is:

1. A threshold logic circuit comprising means for weighting and summing up digital input signals, and means for comparing the sum of the weighted digital input signals with a threshold value and outputting a digital signal depending on the result of the comparison, said threshold logic circuit being characterized in that:
    said means for weighting and summing up digital signals comprises
    a plurality of current switching circuits, output current each of which is switched by the respective input signal, each having current supply means for providing supply current to the respective switching circuit, and said supply current being controlled by each outer control signal, and
    means for summing up the output currents from the current switching circuits 2. A threshold logic circuit claimed in claim 1, wherein said means for summing up the output currents comprises a resistor through which output currents from said current supply circuits commonly flow.

3. A threshold logic circuit claimed in claim 2, wherein said means for comparing comprises another current switching circuit, a state of which is switched depending on a voltage drop across said resistor.

4. A threshold logic circuit claimed in claim 1, wherein said current switching circuits respectively comprise two transistors, the emitters or the sources of which are connected each other, and a controllable current source connected to the emitters or the sources.

5. A threshold logic circuit claimed in claim 4, wherein said controllable current source comprises a serial connection of a transistor and a resistor and means for changing a voltage of the base or the gate of said transistor.

6. A threshold logic circuit claimed in claim 4, wherein said controllable current source comprises a plurality of current switching circuits.

7. A threshold logic circuit claimed in claim 1, wherein said current switching circuits comprise two distinct kinds of current switching circuits having opposite polarities, and the flowing directions of the output currents from the current switching circuits of opposite polarities are opposite.

* * * * *